(12) United States Patent
Kizaki et al.

(10) Patent No.: US 7,897,000 B2
(45) Date of Patent: Mar. 1, 2011

(54) ADHESIVE FILM BONDING METHOD

(75) Inventors: Kiyotaka Kizaki, Tokyo (JP); Hiroshi Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 178 days.

(21) Appl. No.: 12/081,134

(22) Filed: Apr. 10, 2008

(65) Prior Publication Data

US 2008/0257474 A1    Oct. 23, 2008

(30) Foreign Application Priority Data

Apr. 20, 2007   (JP) .............................. 2007-111817

(51) Int. Cl.
*B44C 1/165*   (2006.01)
(52) U.S. Cl. ..................................... 156/230
(58) Field of Classification Search ................. 156/230, 156/267
See application file for complete search history.

(56) References Cited

U.S. PATENT DOCUMENTS 6,149,758 A * 11/2000 Tsujimoto et al. ........... 156/344
6,689,245 B2 * 2/2004 Tsujimoto ................... 156/267
2005/0282362 A1   12/2005 Kobayashi et al.

FOREIGN PATENT DOCUMENTS

| JP | 2006-5080 | 1/2006 |
| JP | 2007-019239 | * 1/2007 |

* cited by examiner

*Primary Examiner* — Khanh Nguyen
*Assistant Examiner* — Vishal I Patel
(74) *Attorney, Agent, or Firm* — Smith, Gambrell & Russell, LLP

(57) ABSTRACT

A method of bonding an adhesive film for die bonding to the rear surface of a wafer having a plurality of devices on the front surface, comprising the steps of holding the front surface side of the wafer on the holding surface of a chuck table for holding the wafer; supplying the adhesive film onto the rear surface of the wafer held on the chuck table; and rolling a pressing-roller while pressing it against the adhesive film supplied onto the rear surface of the wafer to bond the adhesive film to the rear surface of the wafer, wherein the step of rolling the pressing-roller is carried out in such a positional relation that a straight line connecting the center of the wafer and a notch becomes parallel to the axis of the pressing-roller.

2 Claims, 4 Drawing Sheets (a)

(b)

ADHESIVE FILM BONDING METHOD

FIELD OF THE INVENTION

The present invention relates to a method of bonding an adhesive film for die bonding to the rear surface of a wafer having a plurality of devices formed on the front surface.

DESCRIPTION OF THE PRIOR ART

In the production process of a semiconductor device, for example, individual devices are manufactured by forming a device such as IC or LSI in a plurality of areas sectioned by streets (dividing lines) formed in a lattice pattern on the front surface of a substantially disk-like semiconductor wafer and dividing the semiconductor wafer into the areas each having a device formed thereon, along the streets. The thus obtained devices are packaged and widely used in electric equipment such as mobile phones and personal computers.

An adhesive film for die bonding called "die attach film" having a thickness of 70 to 80 μm and made of an epoxy resin or the like is mounted on the rear surfaces of the above individual devices which are then bonded to a die bonding frame for supporting the devices through this adhesive film, by heating. To mount the adhesive film for die bonding onto the rear surfaces of the devices, after the adhesive film is bonded to the rear surface of the semiconductor wafer and the semiconductor wafer is bonded to a dicing tape through this adhesive film, the devices having the adhesive film on the rear surface are formed by cutting the semiconductor wafer together with the adhesive film along the streets formed on the front surface of the semiconductor wafer with a cutting blade.

To bond the adhesive film to the rear surface of the wafer, as disclosed, for example, by JP-A 2006-5080, a method in which the front surface side of the wafer is placed on a chuck table and the adhesive film is supplied onto the rear surface of the wafer (tape bonding surface) and pressed by rolling a pressing-roller to be bonded to the rear surface (tape bonding surface) of the wafer is generally carried out.

In the above adhesive film bonding method, the rolling of the pressing-roller is carried out from the end side where an orientation flat or notch indicating the crystal orientation of the wafer is formed.

Lighter and smaller electric equipment such as mobile phones and personal computers are now in demand, and thinner devices are demanded. When the rear surface of a wafer is ground to reduce its thickness to 100 μm or less and the adhesive film is bonded to the wafer as described above to meet this requirement, a wafer having an orientation flat has no problem but in the case of a wafer having a notch, there is a problem with occurrence of cracks due to the concentration of stress on the notch.

SUMMARY OF THE INVENTION

It is an object of the present invention to provide an adhesive film bonding method capable of bonding an adhesive film even to a wafer having a notch indicating crystal orientation, without breaking it.

To attain the above object, according to the present invention, there is provided a method of bonding an adhesive film for die bonding to the rear surface of a wafer having a plurality of devices formed on the front surface, comprising:

a wafer-holding step for holding the front surface side of the wafer on the holding surface of a chuck table for holding the wafer;

an adhesive film supplying step for supplying the adhesive film onto the rear surface of the wafer held on the chuck table; and a pressing-roller rolling step for rolling a pressing-roller while pressing it against the adhesive film supplied onto the rear surface of the wafer to bond the adhesive film to the rear surface of the wafer, wherein the step of rolling the pressing-roller is carried out in such a positional relation that a straight line connecting the center of the wafer and a notch becomes parallel to the axis of the roller.

In the adhesive film bonding method of the present invention, since the step of rolling the pressing-roller is carried out in such a positional relation that the straight line connecting the center of the wafer and the notch becomes parallel to the axis of the roller, it presses the diameter of the wafer at the time when the pressing-roller passes over the notch, thereby minimizing a load acting on the wafer per unit area. Therefore, the concentration of stress on the notch of the wafer is reduced, thereby making it possible to prevent cracking from the notch.

DETAILED DESCRIPTION OF THE PREFERRED EMBODIMENTS

A preferred embodiment of an adhesive film bonding method according to the present invention will be described in detail with reference to the accompanying drawings.

Figure 1:
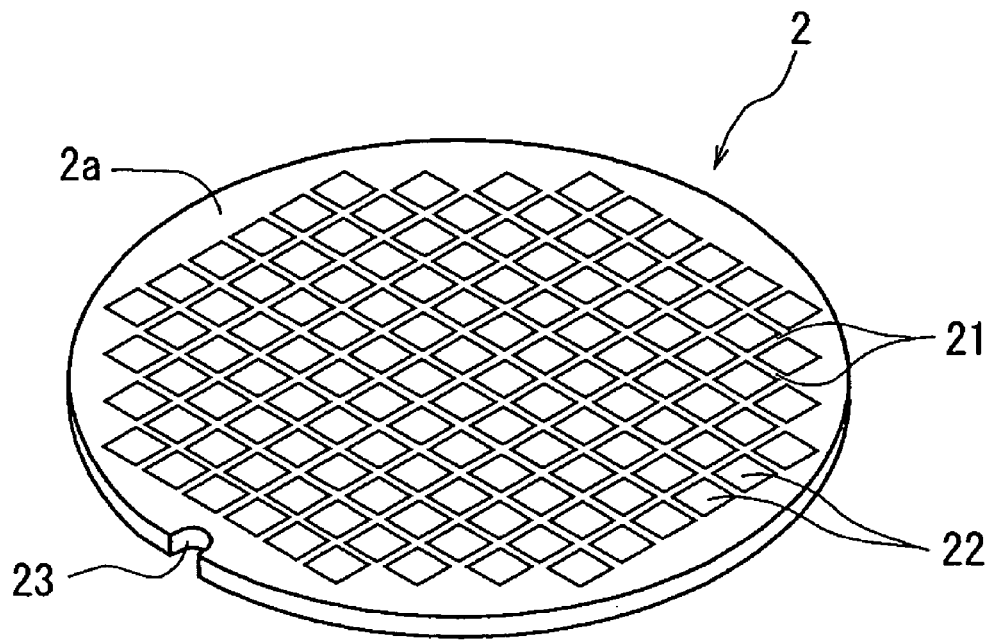
FIG. 1 is a perspective view of a semiconductor wafer as the wafer.

FIG. 1 is a perspective view of a semiconductor wafer as a wafer having the rear surface onto which an adhesive film for die bonding is to be bonded by the adhesive film bonding method of the present invention. The semiconductor wafer 2 shown in FIG. 1 is, for example, a silicon wafer having a thickness of 700 μm, and a plurality of dividing lines 21 are formed in a lattice pattern on the front surface 2a. A device 22 such as IC or LSI is each formed in a plurality of areas sectioned by the plurality of dividing lines 21 formed in the lattice pattern on the front surface 2a of the semiconductor wafer 2. A notch 23 indicating crystal orientation is formed at a specific position of the periphery of the semiconductor wafer 2.

Figure 2:
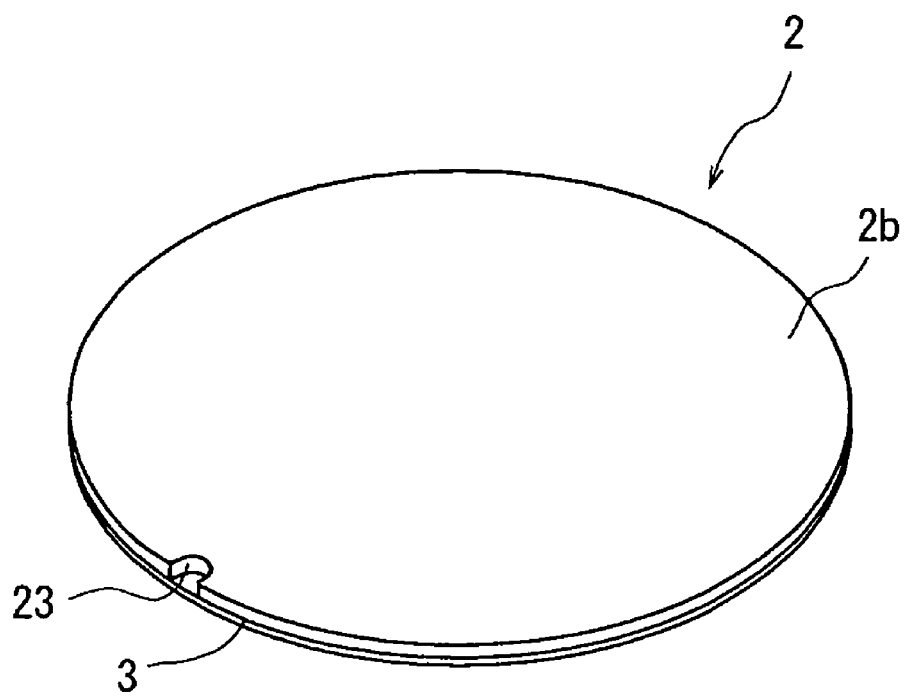
FIG. 2 is a perspective view showing a state of the semiconductor wafer shown in FIG. 1 having undergone the rear surface grinding step to achieve a predetermined thickness.

In the semiconductor wafer 2 shown in FIG. 1, a protective tape 3 is affixed to its front surface 2a as shown in FIG. 2, and the rear surface 2b thereof is ground by a grinding machine until its thickness becomes the finished device thickness (for example, 80 μm) (rear surface grinding step).

Figure 3:
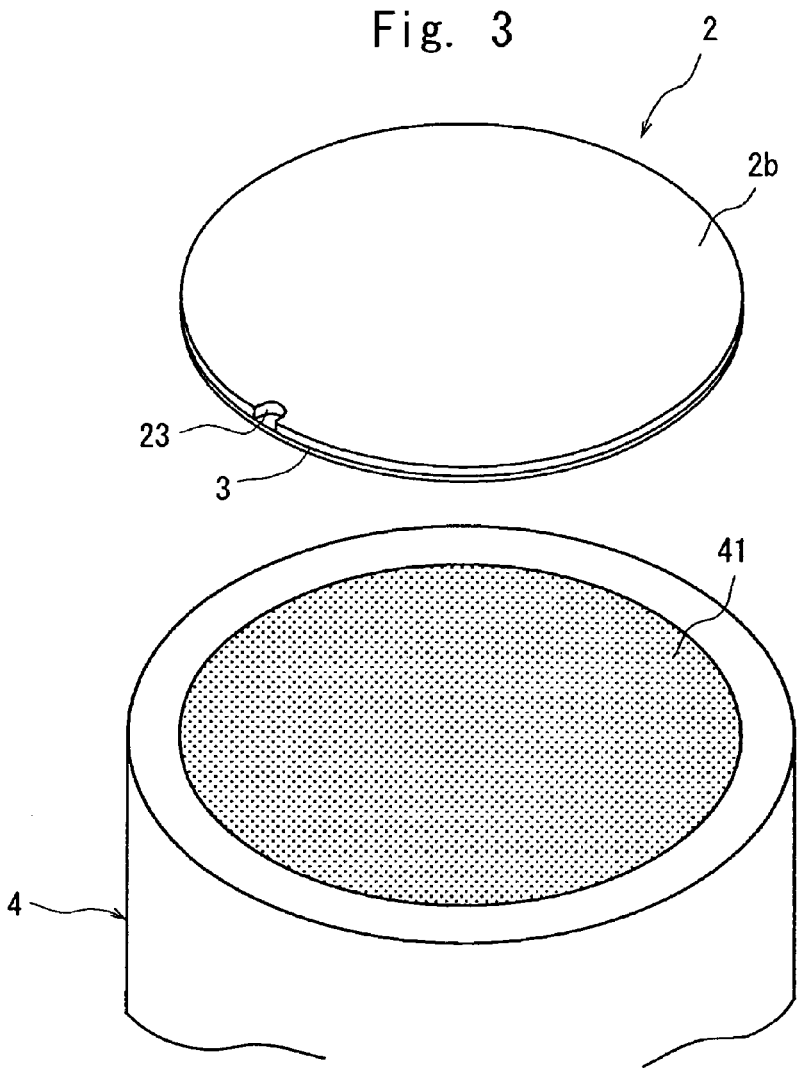
FIGS. 3(a) and 3(b) are explanatory diagrams of a wafer holding step in the adhesive film bonding method of the present invention.
Figure 3:
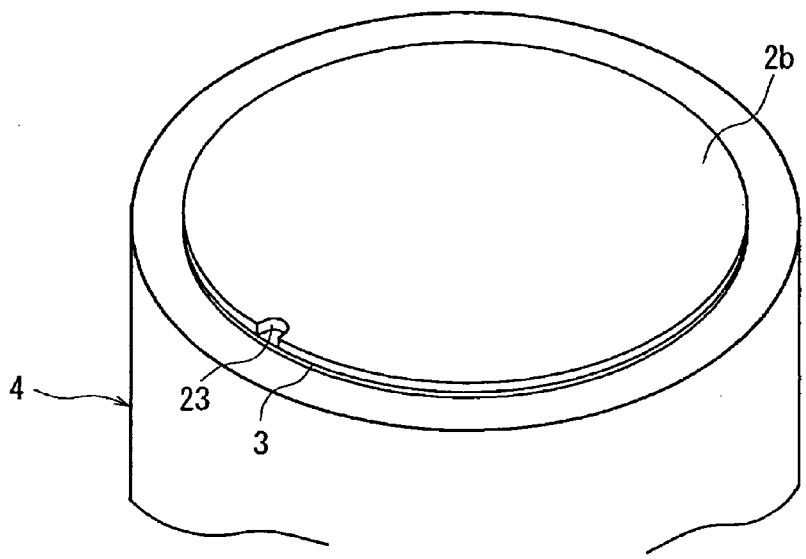

As described above, to bond an adhesive film for die bonding to the rear surface 2b of the semiconductor wafer 2 which has undergone the rear surface grinding step, the protective tape 3 side of the semiconductor wafer 2 is placed on a holding surface 41 of a chuck table 4 of an adhesive film bonding machine, as shown in FIGS. 3(a) and 3(b). Therefore, the rear surface 2b of the semiconductor wafer 2 faces up. By activating a suction means that is not shown, the semiconductor wafer 2 is suction-held on the holding surface 41 of the chuck table 4 (wafer holding step). In the wafer holding step, it is desired that the protective tape 3 side of the semiconductor wafer 2 should be held on the holding surface 41 of the chuck table 4 in a state where the protective tape 3 is affixed to protect the front surface 2a of the semiconductor wafer 2 at the time when the rear surface grinding step is carried out.

Figure 4:
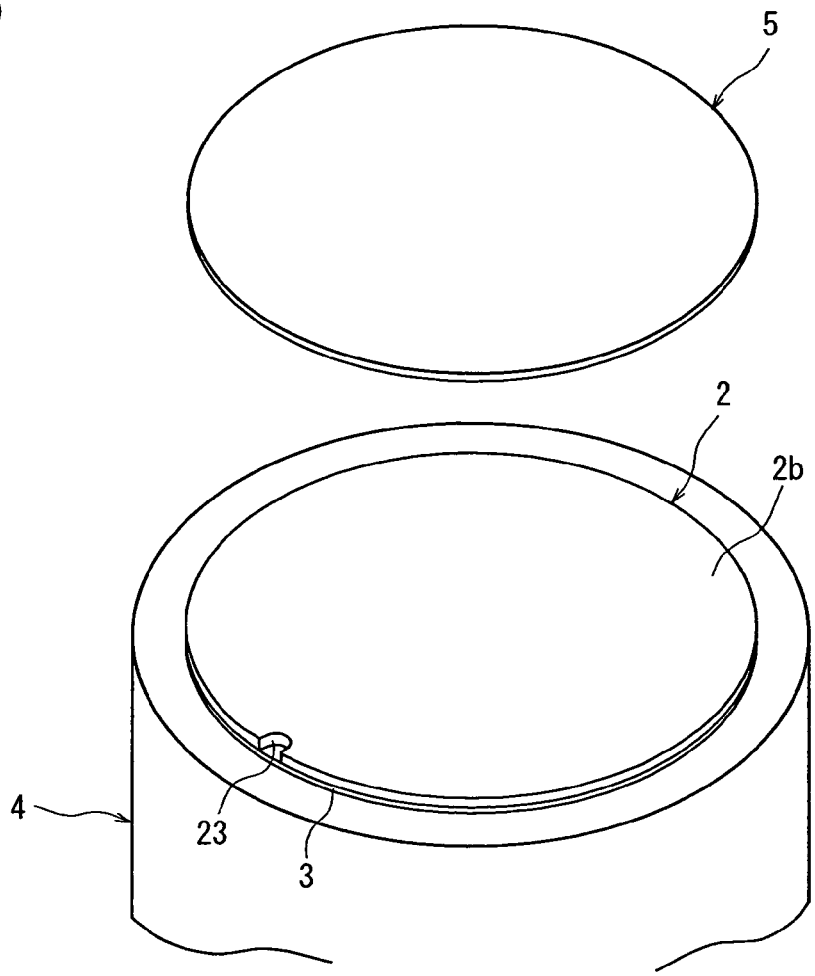
FIGS. 4(a) and 4(b) are explanatory diagrams of an adhesive film supply step in the adhesive film bonding method of the present invention.
Figure 4:
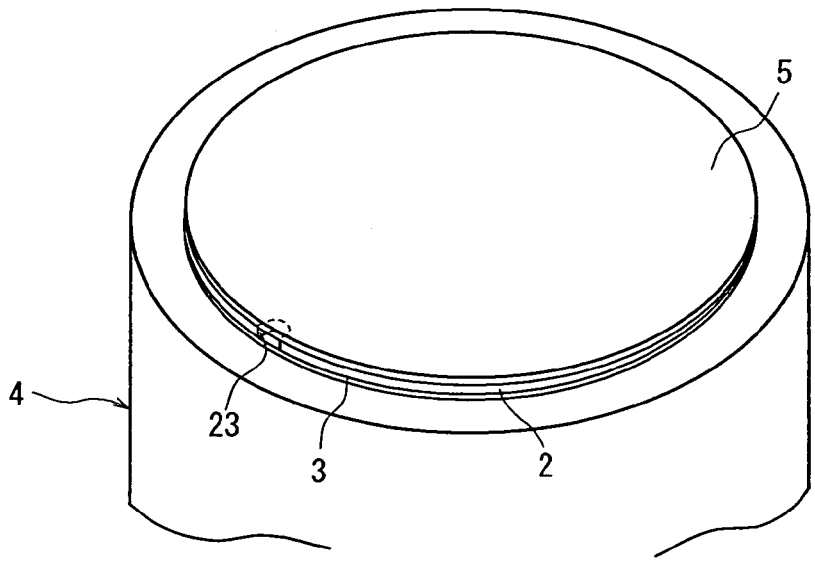

After the above wafer holding step, as shown in FIGS. 4(a) and 4(b), the adhesive film 5 for die bonding is supplied onto the rear surface 2b (top surface) of the semiconductor wafer 2 held on the chuck table 4 (adhesive film supply step).

Figure 5:
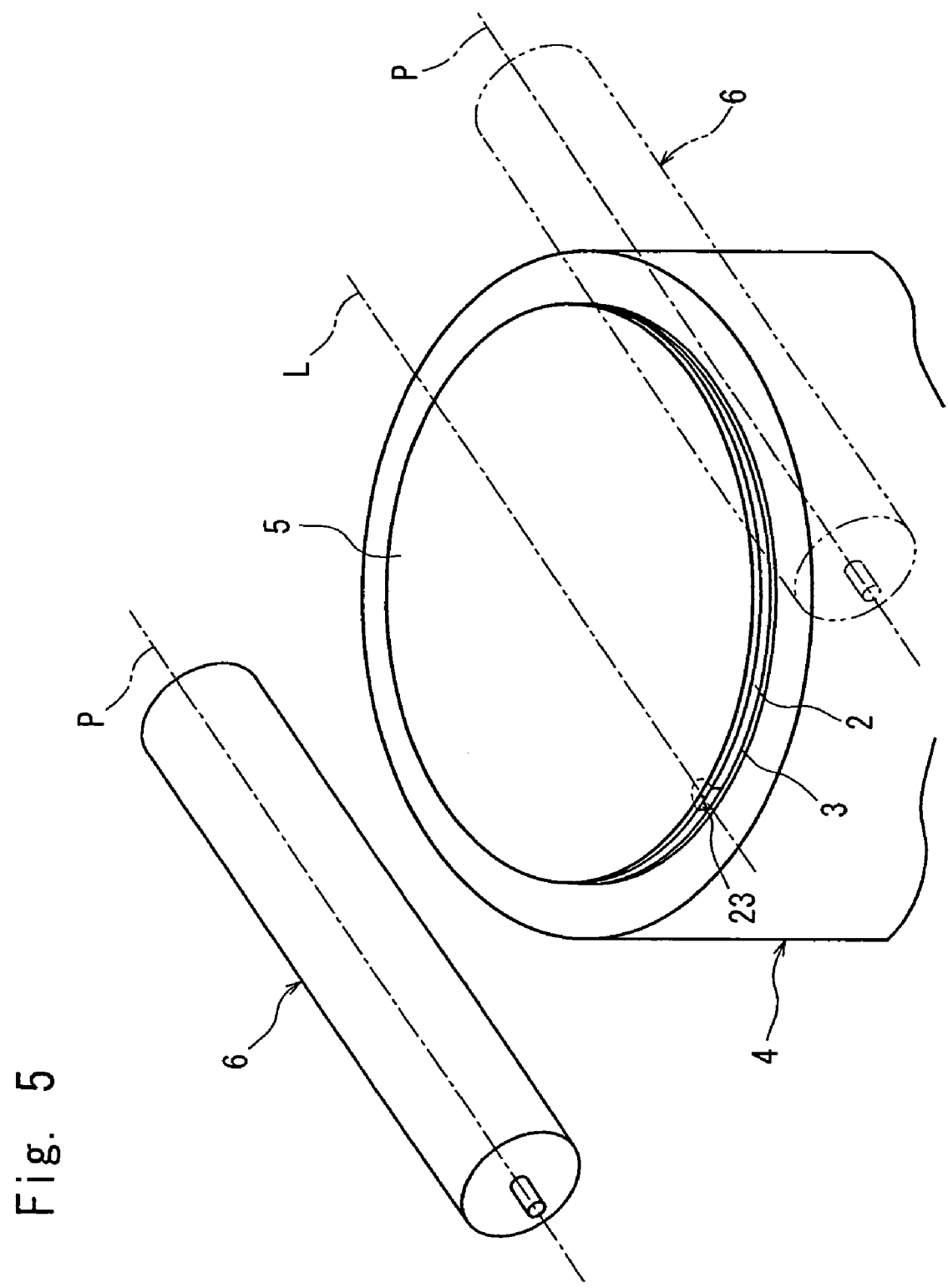
FIG. 5 is an explanatory diagram showing a roller rolling step in the adhesive film bonding method of the present invention.

After the above adhesive film supply step, as shown in FIG. 5, next comes the step of rolling a pressing-roller 6 while pressing it against the adhesive film 5 supplied onto the rear surface 2b of the semiconductor wafer 2 to bond the adhesive film 5 to the rear surface 2b of the semiconductor wafer 2. This roller rolling step is carried out while the adhesive film 5 is heated at 80 to 200° C. from the chuck table 4 side. At this point, it is important that this step should be carried out in such a positional relation that a straight line L connecting the center of the semiconductor wafer 2 and the notch 23 becomes parallel to the axis P of the pressing-roller 6. That is, the straight line L connecting the center of the semiconductor wafer 2 and the notch 23 and the axis P of the pressing-roller 6 are set so as to have a positional relation that the straight line L and the axis P are made parallel to each other, and the pressing-roller 6 is rolled over the adhesive film 5 supplied onto the rear surface 2b of the semiconductor wafer 2 from one end side of the semiconductor wafer 2 shown by the solid lines in FIG. 5 to the other end side shown by the two-dot chain lines in FIG. 5 in a direction orthogonal to the above straight line L. As a result, when the pressing-roller 6 passes over the notch 23, it presses the diameter of the semiconductor wafer 2, thereby minimizing a load acting on the semiconductor wafer 2 per unit area. Therefore, the concentration of stress onto the notch 23 of the semiconductor wafer 2 is reduced, thereby making it possible to prevent cracking from the notch 23.

The semiconductor wafer 2 whose rear surface 2b is bonded to the adhesive film 5 is carried to the subsequent dicing step to be cut along the dividing lines 21 so as to be divided into individual devices 22.

What is claimed is:

1. A method of bonding an adhesive film for die bonding to the rear surface of a wafer having a notch, and a plurality of devices formed on its front surface, comprising:
   a wafer-holding step for holding the front surface of the wafer on the holding surface of a chuck table;
   an adhesive film supplying step for supplying the adhesive film onto the rear surface of the wafer held on the chuck table;
   an alignment step of aligning a pressing-roller having an axial axis so that the axis of the pressing-roller is parallel with a straight line that connects the center of the wafer and bisects the notch; and
   a pressing-roller rolling step for rolling the pressing-roller while pressing it against the adhesive film to bond the adhesive film to the rear surface of the wafer, and while maintaining the parallel relationship between the axis of the pressing-roller and the straight line connecting the center of the wafer and bisecting the notch.

2. The method of attaching an adhesive film according to claim 1, wherein the wafer has a thickness of 100 μm or less.

* * * * *